(12) United States Patent
Kuo

(10) Patent No.: US 8,129,926 B2
(45) Date of Patent: Mar. 6, 2012

(54) LIGHT SOURCE CONTROL DEVICE

(75) Inventor: Fu-Rung Kuo, Taipei (TW)

(73) Assignee: Princeton Technology Corporation, Hsin Tien, Taipei County (TW)

(*) Notice: Subject to any disclaimer, the term of this patent is extended or adjusted under 35 U.S.C. 154(b) by 428 days.

(21) Appl. No.: 12/498,592

(22) Filed: Jul. 7, 2009

(65) Prior Publication Data
US 2010/0164408 A1 Jul. 1, 2010

(30) Foreign Application Priority Data

Dec. 31, 2008 (TW) .............................. 97223949 U

(51) Int. Cl.
H05B 37/02 (2006.01)
(52) U.S. Cl. .................... 315/307; 315/291; 315/308
(58) Field of Classification Search .................. 315/307, 315/291, 308, 194, 224, 209 R, 316; 323/318; 363/44
See application file for complete search history.

(56) References Cited

U.S. PATENT DOCUMENTS 5,142,203 A * 8/1992 Oda et al. ...................... 315/308
6,734,641 B2 * 5/2004 Shoji et al. .................... 315/291

* cited by examiner

Primary Examiner — Daniel D Chang
(74) Attorney, Agent, or Firm — Muncy, Geissler, Olds & Lowe, PLLC

(57) ABSTRACT

A light source control device is provided. A switching seat includes a switching key and a sensing device. A switching circuit is disposed between an external power source and a control circuit to disconnect or connect the external power source, and includes a mechanical switch, an electronic switch and a sensing unit. The mechanical switch is directly connected to the switching key, and is controlled to turn on or off by switching the switching key. The electronic switch is coupled to the sensing unit, and the sensing unit generates a sensing signal to control the electronic switch to turn on or off when the sensing device senses an excitation. The control circuit provides varied power supply to a light source according to the received signal.

12 Claims, 5 Drawing Sheets

_US 8,129,926 B2_

LIGHT SOURCE CONTROL DEVICE

CROSS REFERENCE TO RELATED APPLICATIONS

This Application claims priority of Taiwan Patent Application No. 097223949, filed on Dec. 31, 2008, the entirety of which is incorporated by reference herein.

BACKGROUND OF THE INVENTION

1. Field of the Invention

The invention relates to a light source control device, and more particularly to a light source control device with a mechanical switch and an electronic switch.

2. Description of the Related Art

Electronic apparatuses, such as lamps, fans and so on, do not need complex manipulation. Therefore, a simple switch and a control integrate circuit (IC) are used to control the electronic apparatuses in order to simplify structure and increase manipulate conveniently. The switch is used as a single input terminal that can provide external control which may be varied to provide various operation models according to switching number of the switch correspondingly.

However, with one switch, constant switching damages and wears the switch over time. Therefore, a control device for an additional input terminal for an electronic apparatus that can provide external control thereto which may be varied, is desired.

BRIEF SUMMARY OF THE INVENTION

A light source control device for a light source is provided. A sensing device is disposed to add another input terminal to a light source, providing external control thereto which may be varied, thus decreasing damage and wear to a single switch which is used as an input terminal.

An exemplary embodiment of a light source control device is provided. The light source control device comprises a switching seat, a switching circuit and a control circuit. The switching seat comprises a switching key and a sensing device. The switching circuit is disposed between an external power source and the control circuit to disconnect or connect the external power source, and comprises a mechanical switch, an electronic switch and a sensing unit. The mechanical switch is directly connected to the switching key, and the mechanical switch is controlled to turn on or off by switching the switching key. The electronic switch is coupled to the sensing unit, and the sensing unit generates a sensing signal to control the electronic switch to turn on or off when the sensing device senses an excitation. The control circuit comprises an output unit, a control unit and a detecting unit, wherein the control circuit provides varied power supply to the light source according to a received signal.

The light source control device of the invention decreases damage and wear to switches of electronic apparatuses. In the invention, the sensing device functions as an additional input terminal, such that two control operations "switching" and "powering on/off" are controlled by different input terminals, thus decreasing damage and wear to switches and increasing operating lifespan.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIG. 1 to FIG. 4 show a light source control device for controlling a fluorescent lamp A according to an embodiment of the invention, wherein a power supplied to the fluorescent lamp A is a direct current (DC) power and an external power source B is an alternating current (AC) power. The light source control device comprises a switching seat 1, a switching circuit 2 and a control circuit 3.

Figure 1:
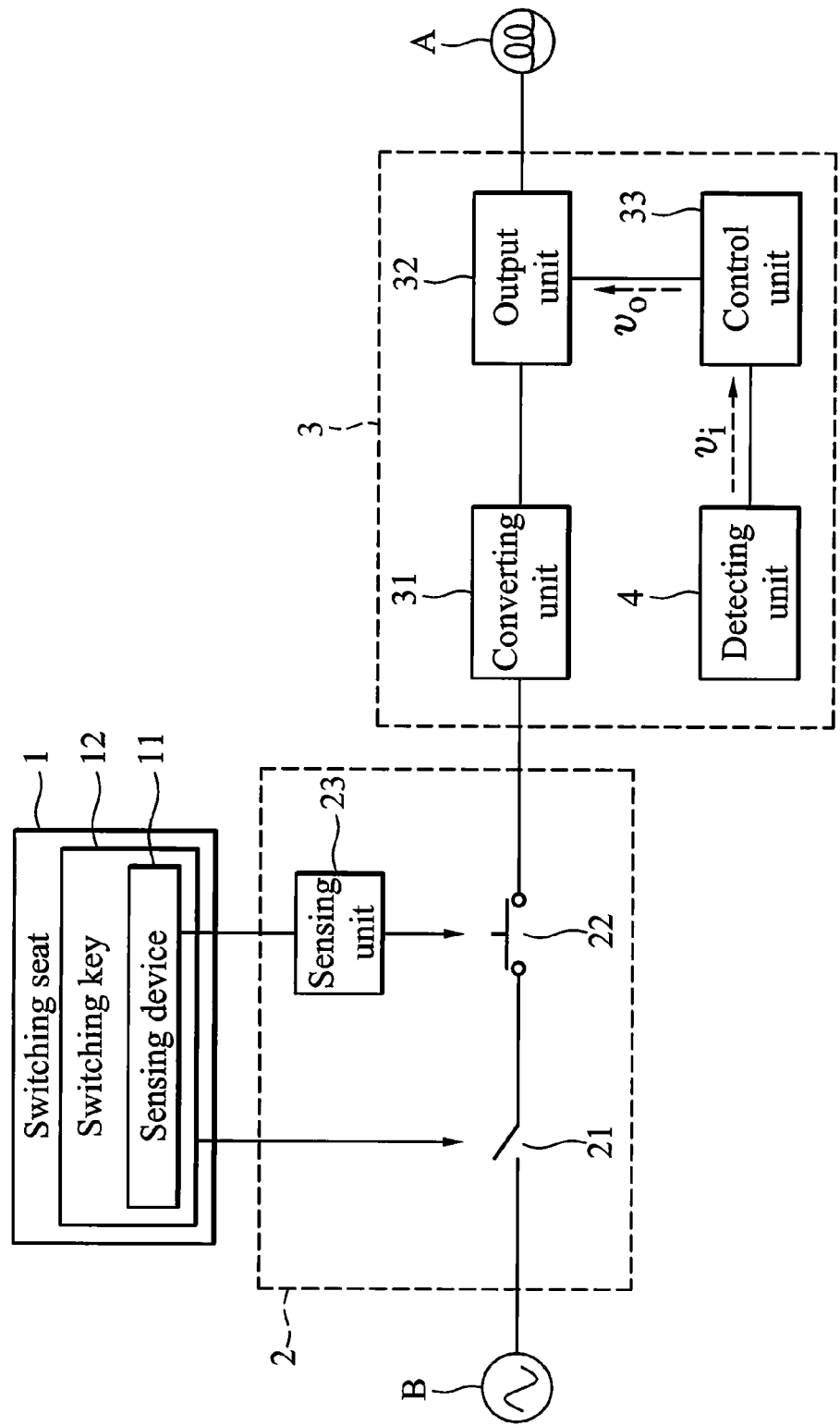
FIG. 1 shows a block diagram of a light source control device according to an embodiment of the invention.
Figure 3:
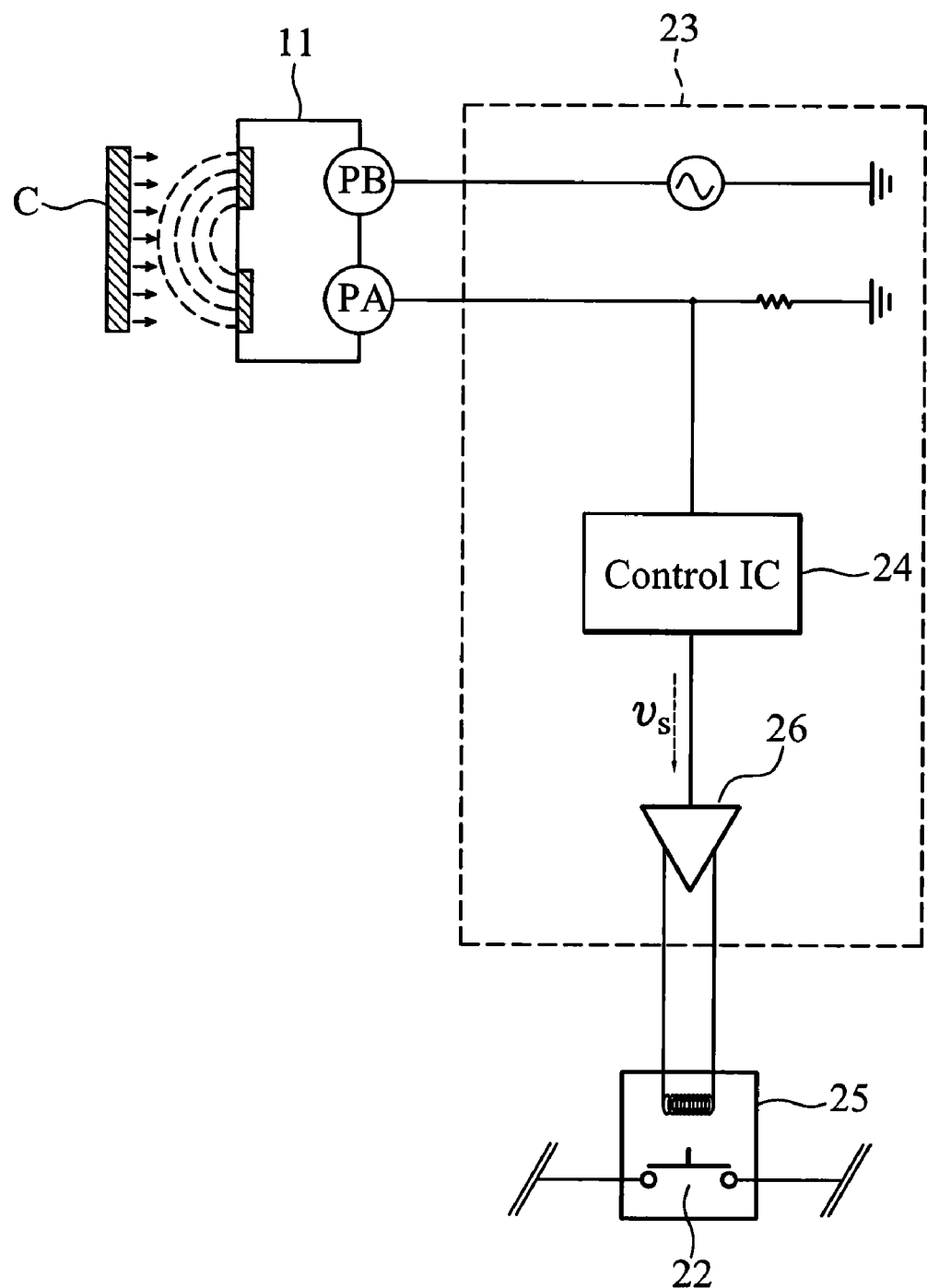
FIG. 3 shows a schematic diagram of a sensing unit according to an embodiment of the invention.

The switching seat 1 comprises a sensing device 11 and a switching key 12. The sensing device 11 is a capacitor type object sensor comprising a capacitor which is composed of two flat plates PA and PB, as shown in FIG. 3. A dielectric material is disposed between the flat plates PA and PB. A current is flowed therethrough when a signal is coupled from the flat plate PA to PB. If no object C approaches to a sensing area formed by the flat plates PA and PB, the coupling value is very small. If the object C appears in the sensing area, capacitance of the capacitor may be changed to vary the coupling value (i.e. the sensing device 11 senses an excitation). The sensing device 11 is disposed in a lower half position of the switching key 12, as shown in FIG. 1.

The switching circuit 2 disposed between the external power source B and the control circuit 3 is used to disconnect or connect the external power source B. The switching circuit 2 comprises a mechanical switch 21, an electronic switch 22 and a sensing unit 23. The mechanical switch 21 and the electronic switch 22 are connected in series, wherein one end of the switches connected in series is coupled to the external power source B and the other end is coupled to the control circuit 3. The mechanical switch 21 is directly connected to the switching key 12, wherein the mechanical switch 21 is controlled to turn on or off by switching the switching key 12. The electronic switch 22 is coupled to the sensing unit 23, and the sensing unit 23 is coupled to the sensing device 11, wherein the electronic switch 22 is a normal closed switch. The sensing unit 23 comprises a control integrated circuit (IC) 24, a relay 25 and an amplifier 26, as shown in FIG. 3. The control IC 24 is coupled between the amplifier 26 and the sensing device 11, and the relay 25 is coupled to the amplifier 26. When the sensing device 11 senses an excitation, the control IC 24 may generate a sensing signal $v_s$ to the amplifier 26 which amplifies the sensing signal $v_s$ and transmits the amplified signal to the relay 25. When receiving the excitation, the relay 25 may control the electronic switch 22 to switch on.

The control circuit 3 comprises a converting unit 31, an output unit 32, a control unit 33 and a detecting unit 4. The converting unit 31 is disposed between the switching circuit 2 and the output unit 32. When a power supplied to the fluorescent lamp A is a DC power and the external power source B is an AC power, the converting unit 31 converts the AC power into the DC power for the fluorescent lamp A. The converting unit 31 is a standard rectifying and filtering circuit comprising a bridge rectifier and a capacitor.

Figure 2:
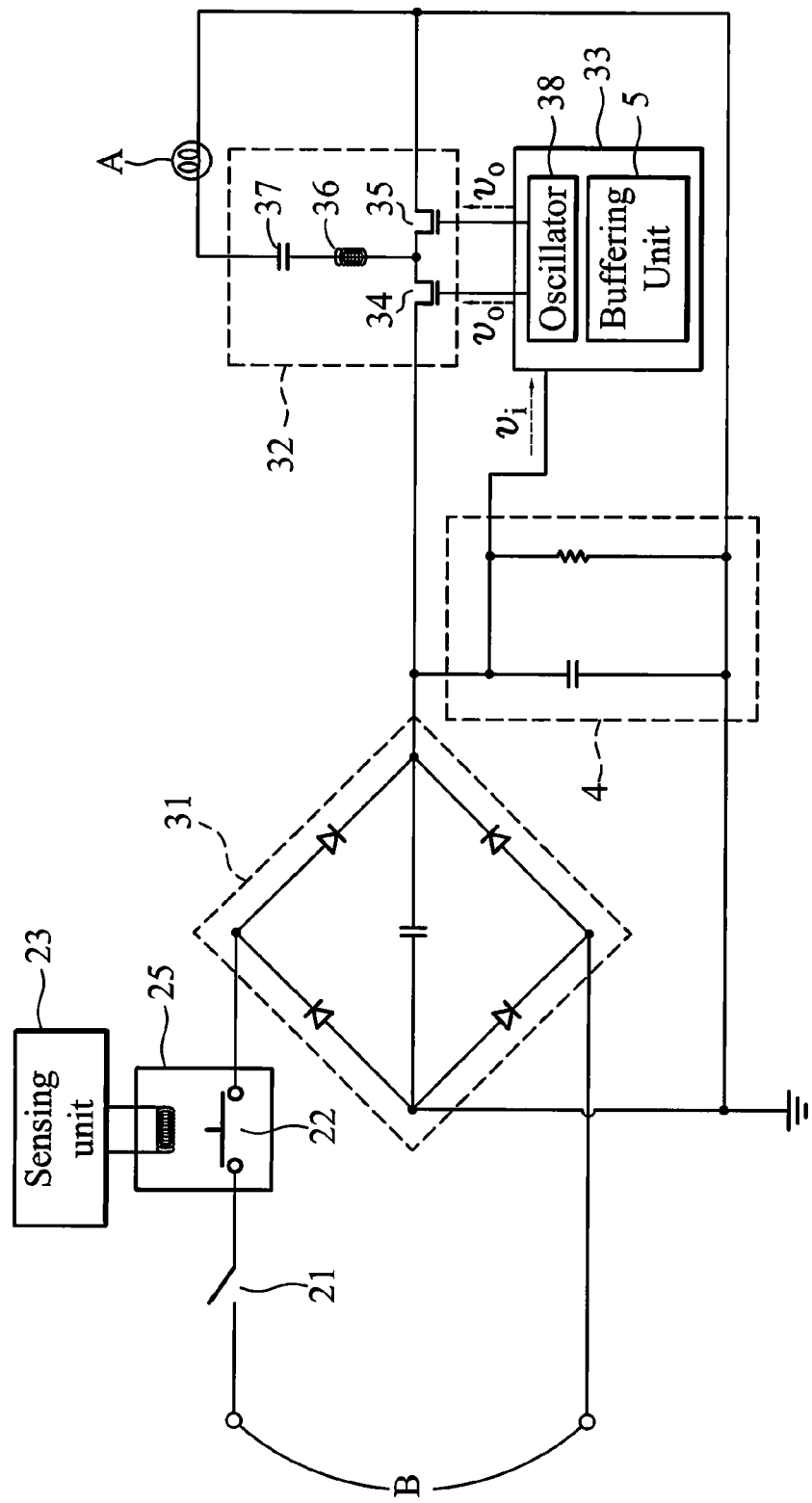
FIG. 2 shows a schematic diagram of a light source control device according to an embodiment of the invention.

Referring to FIG. 2, the output unit 32 is coupled between the converting unit 31 and the fluorescent lamp A, and provides varied power supply to the fluorescent lamp A according to a control signal $v_0$ generated by the control unit 33. The output unit 32 comprises an NMOS transistor 34, an NMOS transistor 35, an inductor 36 and a capacitor 37. A drain of the NMOS transistor 34 is coupled to the converting unit 31 to receive the DC power converted by the converting unit 31. A gate of the NMOS transistor 34 is coupled to the control unit 33 to receive the control signal $v_0$. A drain of the NMOS transistor 35 is coupled to a source of the NMOS transistor 34. A gate of the NMOS transistor 35 is coupled to the control unit 33 to receive the control signal $v_0$. A source of the NMOS transistor 35 is coupled to a virtual ground terminal. One end of the inductor 36 is coupled between the source of the NMOS transistor 34 and the drain of the NMOS transistor 35, and the other end of the inductor 33 is coupled to one end of the capacitor 37. Another end of the capacitor 37 is coupled to the fluorescent lamp A.

Figure 4:
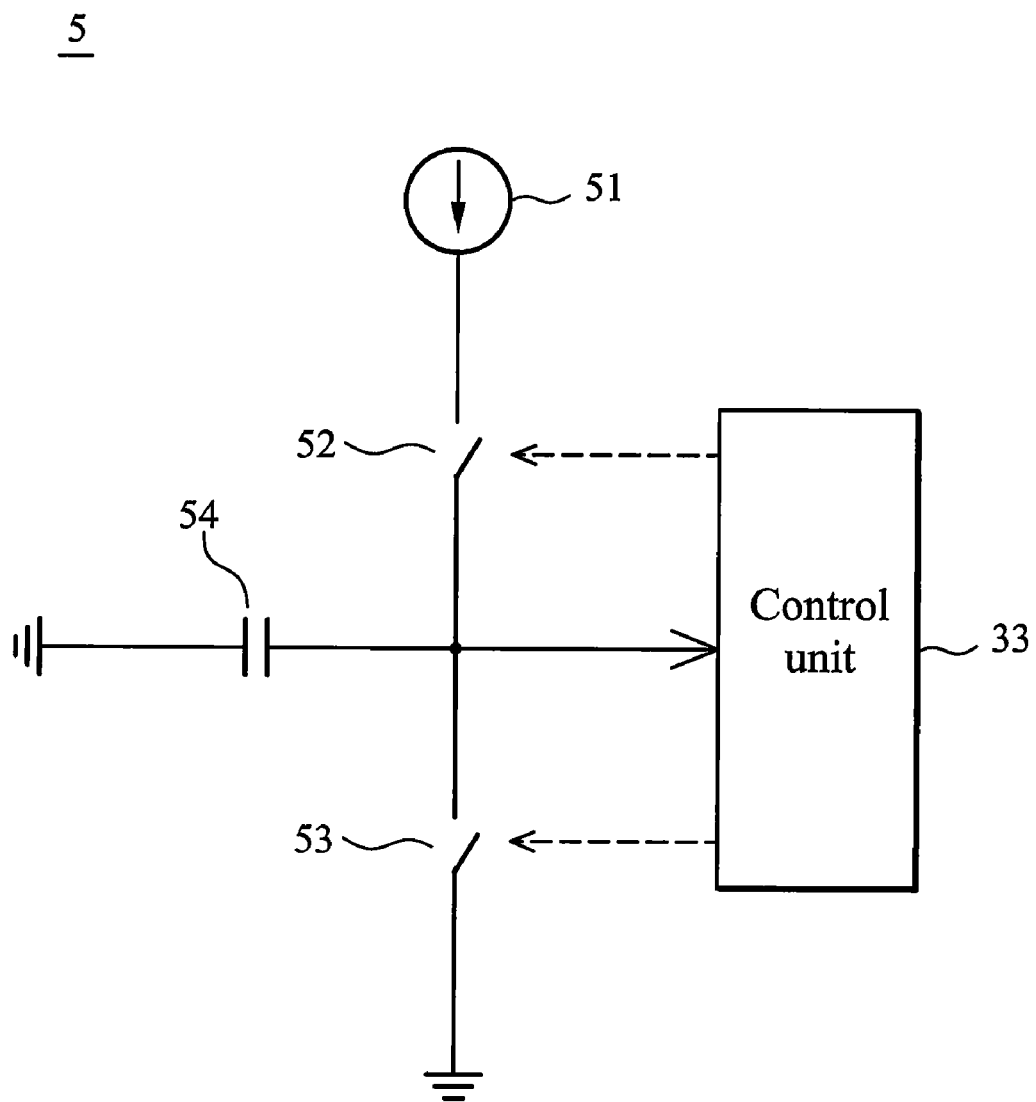
FIG. 4 shows a schematic diagram of a buffering unit according to an embodiment of the invention.

Referring to FIGS. 1, 2 and 4 together, the control unit 33 receives a detecting signal $v_i$ from the detecting unit 4 and provides the control signal $v_0$ corresponding to the received detecting signal $v_i$ to the output unit 32. The control unit 33 comprises a buffering unit 5 which is used to buffer the received signal for a time period t and provide the control signal $v_0$ to the output unit 32 after the time period t has reached. The buffering unit 5 comprises a micro-current source 51, two switches 52 and 53 and a capacitor 54. The two switches 52 and 53 are connected in series, wherein one end of the switches connected in series is coupled to the micro-current source 51 and the other end is coupled to a ground terminal. One end of the capacitor 54 is coupled between the switches 52 and 53 and the other end of the capacitor 54 is coupled to the ground terminal. The micro-current source 51 may provide a stable micro-current. The control unit 33 controls the switches 52 and 53 to turn on or off according to the received signal, so as to control whether the capacitor 54 is charged by the micro-current source 51. The buffering time period t is the time for the micro-current source 51 to finish charging the capacitor 54. In addition, the control unit 33 further comprises an oscillator 38. The control unit 33 changes a frequency of the oscillator 38 to output a current with various values to the output unit 32. Therefore, the control signal $v_0$ transmitted from the control unit 33 to the output unit 32 is the current.

Referring to FIGS. 1 and 2 together, the detecting unit 4 is used to detect power from the switching circuit 2 and generate the detecting signal $v_i$ to the control unit 33 according to the power variation, wherein the detecting unit 4 is a circuit composed of a resistor and a capacitor connected in parallel.

A control method for a light source control device according to an embodiment of the invention is next provided. First, a switching key is pressed to turn on a mechanical switch, and an electronic switch is turned on to connect an external power source. Note that the electronic switch is a normal closed switch. Next, a power is provided to a converting unit, and the converting unit converts the power from AC to DC and provides the DC power to an output unit. Next, a control unit uses the buffering unit to delay a time period t to generate and output a control signal to the output unit. Next, the output unit generates a current with a first value to the fluorescent lamp according to the control signal generated by the control unit. Next, the fluorescent lamp is lighted at a first brightness. When an object C appears in a sensing area of a sensing device, an excitation is sensed by the sensing device and the electronic switch is switch to turn off. When the object C departs from the sensing area, the electronic switch is switch to turn on. Next, a detecting unit detects the power variation and generates a detecting signal $v_i$ to the control unit which delays a time period t to generate and output another control signal to the output unit. Next the output unit generates a current with a second value to the fluorescent lamp according to another control signal, and thereby the fluorescent lamp is lighted at a second brightness and so on. When the sensing device senses each excitation, the lighted brightness of the fluorescent lamp is changed to a corresponding brightness. Finally, the switching circuit is turned off. When the sensing device senses an excitation and a delay time t corresponding to the last excitation has not reached, the control unit stops counting the delay time t corresponding to the last excitation and starts to count a delay time t corresponding to the excitation.

Figure 5:
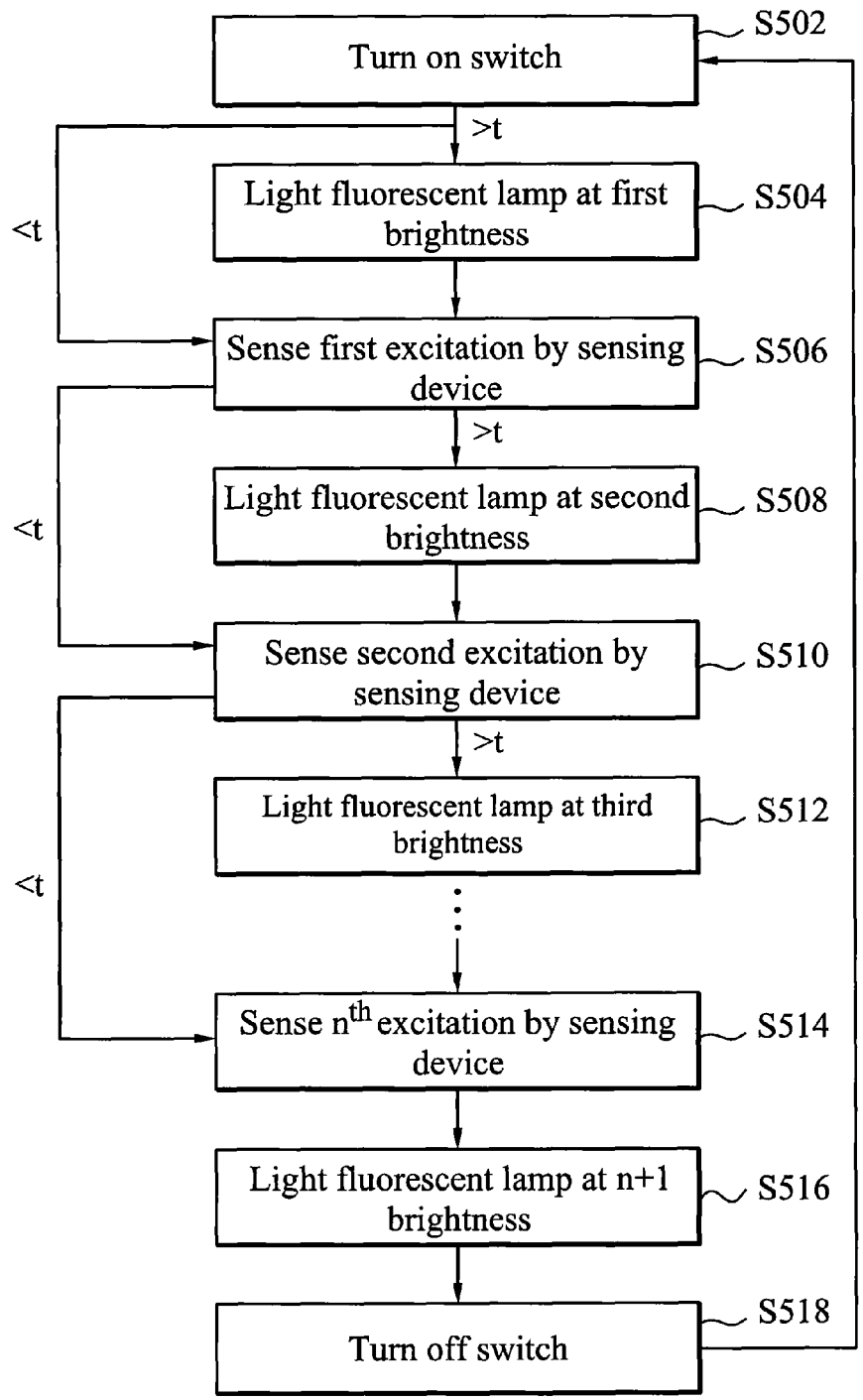
FIG. 5 shows a flowchart illustrating a method for lighting a fluorescent lamp by a light source control device according to an embodiment of the invention.

Referring to FIG. 5, a method for lighting a fluorescent lamp by a light source control device according to an embodiment of the invention is shown. First, in step S502, a switching key is pressed to turn on. Next, after delaying for a first time t, the fluorescent lamp is lighted at a first brightness (step S504). Next, a sensing device senses a first excitation due to an object C appearing in a sensing area of the sensing device (step S506), such as a user's hand approaching the sensing device. Next, after delaying a second time t, the fluorescent lamp is lighted at a second brightness (step S508). Next, the sensing device senses a second excitation (step S510), such as the user's hand approaching the sensing device again. Next, after delaying for a third time t, the fluorescent lamp is lighted at a third brightness (step S512), and so on (steps S514 and S516) until the switching key is turned off (step S518). When the sensing device senses an excitation and a delay time t corresponding to the last excitation has not been reached, counting of the delay time t corresponding to the last excitation is stopped and a delay time t corresponding to the excitation is started. The fluorescent lamp is lighted at a brightness corresponding to the current excitation when no new excitation is sensed before the delay time t corresponding to the current excitation is reached.

Therefore, the light source control device of the invention decreases damage and wear to switches of electronic apparatuses. In the invention, the sensing device functions as an additional input terminal, such that two control operations "switching" and "powering on/off" are controlled by different input terminals, thus decreasing damage and wear to switches of electronic apparatuses and increasing operating lifespan. Furthermore, in addition to increasing the amount of switches and adding the sensing device, only the switching circuit is needed to be modified and not the control circuit, thus simplifying design applications. In addition, when turning on or off the fluorescent lamp, the charging buffer time may avoid flickering of the fluorescent lamp. Simultaneously, power is saved and operating lifespan of the fluorescent lamp is increased. Moreover, disposing the sensing device in the switching key is similar to past habit for uses to switch light source, and user false touch is avoided by disposing the sensing device in a half position of the switching key, such as the right, left, lower or higher half position.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A light source control device, comprising:
a switching seat, a switching circuit and a control circuit, wherein:
the switching seat comprises a switching key and a sensing device;
the switching circuit is disposed between an external power source and the control circuit to disconnect or connect the external power source, and comprises a mechanical switch, an electronic switch and a sensing unit, wherein:
the mechanical switch and the electronic switch are connected in series, and one end of the switches connected in series is coupled to the external power source and the other end is coupled to the control circuit;
the mechanical switch is directly connected to the switching key, and the mechanical switch is controlled to turn on or off by switching the switching key; and
the electronic switch is coupled to the sensing unit and the sensing unit is coupled to the sensing device, and the sensing unit generates a sensing signal to control the electronic switch to turn on or off when the sensing device senses an excitation; and
the control circuit comprises:
an output unit coupled to the switching circuit and a light source, providing varied power supply to the light source according to a control signal;
a control unit receiving a detecting signal and generating the control signal to the output unit according to the received signal;
a detecting unit detecting a power from the switching circuit and generating the detecting signal to the control unit according to variation of the power; and
a buffering unit, buffering the received signal until a specific time period has been reached, transmitting the control signal to the output unit when the specific time period has been reached, and comprising:
a micro-current source providing a stable micro-current;
two switches connected in series, wherein one end of the switches connected in series is coupled to the micro-current source and the other end is coupled to a ground terminal; and
a capacitor, wherein one end of the capacitor is coupled between the switches and the other end of the capacitor is coupled to the ground terminal,
wherein the control unit controls the two switches to charge the capacitor according to the received signal, and the specific time period is a time for the micro-current source to finish charging the capacitor.

2. The light source control device as claimed in claim 1, further comprising:

a converting unit disposed between the switching circuit and the output unit, wherein when a power supplied to the light source is a DC power and the external power source is an AC power, and the converting unit converts the AC power into the DC power for the light source.

3. The light source control device as claimed in claim 2, wherein the converting unit is a standard rectifying and filtering circuit comprising a bridge rectifier and a capacitor.

4. The light source control device as claimed in claim 1, wherein the detecting unit is a circuit composed of a resistor and a capacitor connected in parallel.

5. The light source control device as claimed in claim 1, wherein the control unit comprises an oscillator, wherein the control unit changes a frequency of the oscillator according to the received signal to output a current with various values to the output unit, and the control signal transmitted from the control unit to the output unit is the current.

6. The light source control device as claimed in claim 2, wherein the output unit comprises:
a first NMOS transistor comprising a drain coupled to the converting unit for receiving the DC power and a gate coupled to the control unit for receiving the control signal;
a second NMOS transistor comprising a drain coupled to a source of the first NMOS transistor, a gate coupled to the control unit for receiving the control signal and a source coupled to a virtual ground terminal;
a inductance, wherein one end of the inductor is coupled between the source of the first NMOS transistor and the drain of the second NMOS transistor; and
a capacitor coupled between the light source and the other end of the inductance.

7. The light source control device as claimed in claim 1, wherein the light source is a fluorescent lamp.

8. The light source control device as claimed in claim 1, wherein the sensing unit comprises a control integrated circuit, a relay and an amplifier, wherein and the control integrated circuit is coupled to the amplifier and the sensing device, the relay is coupled to the amplifier, the control integrated circuit generates the sensing signal to the amplifier when the sensing device senses an excitation, and the amplifier amplifies the sensing signal and transmits the amplified signal to the relay, so as to control the electronic switch to turn on or off.

9. The light source control device as claimed in claim 8, wherein the electronic switch is a normal closed switch, and the sensing unit generates the sensing signal to turn on the electronic switch when the sensing device senses the excitation.

10. The light source control device as claimed in claim 1, wherein the sensing device is a capacitor type object sensor.

11. The light source control device as claimed in claim 1, wherein the sensing device is directly disposed in a right half position or a left half position of the switching key.

12. The light source control device as claimed in claim 1, wherein the sensing device is directly disposed in a lower half position or a higher half position of the switching key.

* * * * *